United States Patent
Lee et al.

(10) Patent No.: US 6,495,925 B1
(45) Date of Patent: Dec. 17, 2002

(54) SEMICONDUCTOR CHIP AND A LEAD FRAME

(75) Inventors: Choon Muah Patricia Lee, Singapore (SG); Soong Ooi Yong, Singapore (SG); Pramod Kumar Pandey, Singapore (SG); Chong Hsu Liu, Singapore (SG)

(73) Assignee: Infineon Technologies A.G., Munich (DE)

( * ) Notice: Subject to any disclaimer, the term of this patent is extended or adjusted under 35 U.S.C. 154(b) by 0 days.

(21) Appl. No.: 09/856,192

(22) PCT Filed: Nov. 17, 1998

(86) PCT No.: PCT/SG98/00093

§ 371 (c)(1),
(2), (4) Date: Jan. 4, 2002

(87) PCT Pub. No.: WO00/30170

PCT Pub. Date: May 25, 2000

(51) Int. Cl.$^7$ .................................................. H01L 29/40
(52) U.S. Cl. ........................ 257/786; 257/666; 257/691
(58) Field of Search ................................. 257/786, 666, 257/691; 438/123

(56) References Cited

U.S. PATENT DOCUMENTS

| | | | |
|---|---|---|---|
| 5,229,824 A | | 7/1993 | Kozuka |
| 5,719,449 A | * | 2/1998 | Strauss ........................ 257/786 |
| 5,869,898 A | | 2/1999 | Sato |
| 5,929,511 A | * | 7/1999 | Nakazawa et al. .......... 257/666 |
| 5,962,926 A | * | 10/1999 | Torress et al. ............... 257/786 |
| 6,242,814 B1 | * | 6/2001 | Bassett ........................ 257/786 |

FOREIGN PATENT DOCUMENTS

| | | |
|---|---|---|
| JP | 2246235 | 10/1990 |
| JP | 5144944 | 6/1993 |
| JP | 5326712 | 12/1993 |
| JP | 6310650 | 11/1994 |

* cited by examiner

Primary Examiner—Jasmine J B Clark
(74) Attorney, Agent, or Firm—Senniger, Powers, Leavitt & Roedel

(57) ABSTRACT

A semiconductor chip includes a semiconductor substrate having an electronic circuit theron and a number of bond pads thereon. The bond pads are coupled to the electronic circuit and permit power to be supplied to the electronic circuit and signals to be input to and output from the electronic circuit. The bond pads are arranged on the surface of the substrate such that at least some of the pads are separated from the edge of the substrate by other bond pads. A lead frame is also provided in which two of the contact pins are electrically coupled to each other by a contact strip which extends along at least a portion of an edge of a die pad. The contact strip is located between the die pad and some of the other contact pins.

5 Claims, 2 Drawing Sheets

SEMICONDUCTOR CHIP AND A LEAD FRAME

CROSS-REFERENCE TO RELATED APPLICATION

This application is a 35 U.S.C. §371 national stage application based on PCT Application Serial No. PCT/SG98/00093 filed Nov. 17, 1998, the entire disclosure of which is incorporated herein by reference.

BACKGROUND OF THE INVENTION

The invention relates to a semiconductor chip and a lead frame on which the semiconductor chip is to be mounted.

With the advent of smaller (less than 0.5 µm) semiconductor technologies, complex functionality and systems can be integrated on a single chip. However, cost effective packaging of such devices is a challenge, due to the large number of external functional and power supply pins which are required for such devices. The interface between the external package and the chip core is normally through bond pads on the silicon surface of the chip. These can take up a large proportion (sometimes greater than 50%) of the total surface area of the silicon chip.

Accordingly, the size of a silicon chip is limited to a large extent by the number of pads that are required and the space that the pads occupy on the surface area of the silicon chip.

With current silicon chip designs the pads are arranged in side by side relationship on the surface of the silicon chip adjacent the edges of the chip to permit easy access for wire bonding from the pads to the corresponding pins on the lead frame. Hence, if a large number of pads are required for a specific chip design, it is necessary to increase the edge length of the silicon chip to accommodate the additional pads. This inevitably causes an increase in the size of the silicon chip.

There is also a further problem with trying to reduce the size of a packaged silicon chip. Pins are required on the lead frame which are coupled to the bond pads on the silicon chip. It is the pins which couple the bond pads to external devices and supply power to the silicon chip. Therefore, if a silicon chip has a large number of pads then a correspondingly large number of pins are also required. The large number of pins has the problem of increasing the final package size of the silicon chip.

One attempt at reducing the total number of pins has involved reducing the number of power supply pins which are required by "double bonding" two power supply bond pads to one pin.

However, this has the disadvantage that it does not permit strategic placement of the power supply bond pads on the surface of the silicon chip. This is important to achieve good noise performance on the chip.

SUMMARY OF THE INVENTION

In accordance with a first aspect of the present invention, a semiconductor chip comprises a semiconductor substrate having an electronic circuit thereon and a number of bond pads thereon, the bond pads being coupled to the electronic circuit and permitting power to be supplied to the electronic circuit and signals to be input to and output from the electronic circuit, the bond pads being arranged on the surface of the substrate such that at least some of the pads are separated from the edge of the substrate by other bond pads.

An advantage of the invention is that by not having all the bond pads adjacent to an edge of the substrate, it is possible to minimise the required surface area of the semiconductor substrate.

Preferably, the at least some pads are arranged such that they are offset from the immediately adjacent bond pads which are adjacent to the edge of the semiconductor substrate.

In accordance with a second aspect of the present invention, a lead frame comprises a die pad adapted to have a semiconductor chip mounted thereon and a number of contact pins adapted to be electrically coupled to bond pads on a semiconductor chip mounted on the die pad, in use, two of the contact pins being electrically coupled to each other by a contact strip which extends along at least a portion of an edge of the die pad, and the contact strip being located between the die pad and some of the other contact pins.

An advantage of this aspect of the invention is that by providing two contact pins which are electrically interconnected by a contact strip, it is possible to have a lead frame with a power supply contact pin which extends from one side of the die pad to the opposite side of the die pad such that bond pads on the semiconductor chip may be electrically connected to any point on the contact strip extending between the two contact pins. This has the advantage that it is possible to arrange the power supply bond pads on the semiconductor chip to achieve, for example, good noise performance, while still permitting the power supply bond pads to be electrically coupled to the power supply contact pins. It also has the advantage that only two contact pins are required for a number of power supply bond pads.

Typically, two pairs of contact pins may each be electrically coupled to each other, each pair being electrically coupled by a respective contact strip, such that the first contact strip is located between an edge of the die pad and the second contact strip, and the second contact strip is located between the first contact strip and some of the other contact pins. This has the advantage of permitting two different supply voltages to be supplied to the same silicon chip.

If necessary, more pairs of pins could be electrically coupled to each other using further contact strips in order to provide further power supplies, if necessary.

Preferably, the contact strip extends along the full length of at least one edge of the die pad, which is preferably the edge of the die pad which would be adjacent to the edge of the semiconductor chip which has the power supply pads adjacent to it, when the semiconductor chip is mounted on the die pad.

Preferably, the die pad is adapted to have a silicon chip in accordance with the first aspect mounted thereon.

BRIEF DESCRIPTION OF THE DRAWINGS

An example of a semiconductor chip and a lead frame in accordance with the invention will now be described with reference to the accompanying drawings in which.

DETAILED DESCRIPTION OF THE INVENTION

Figure 1:
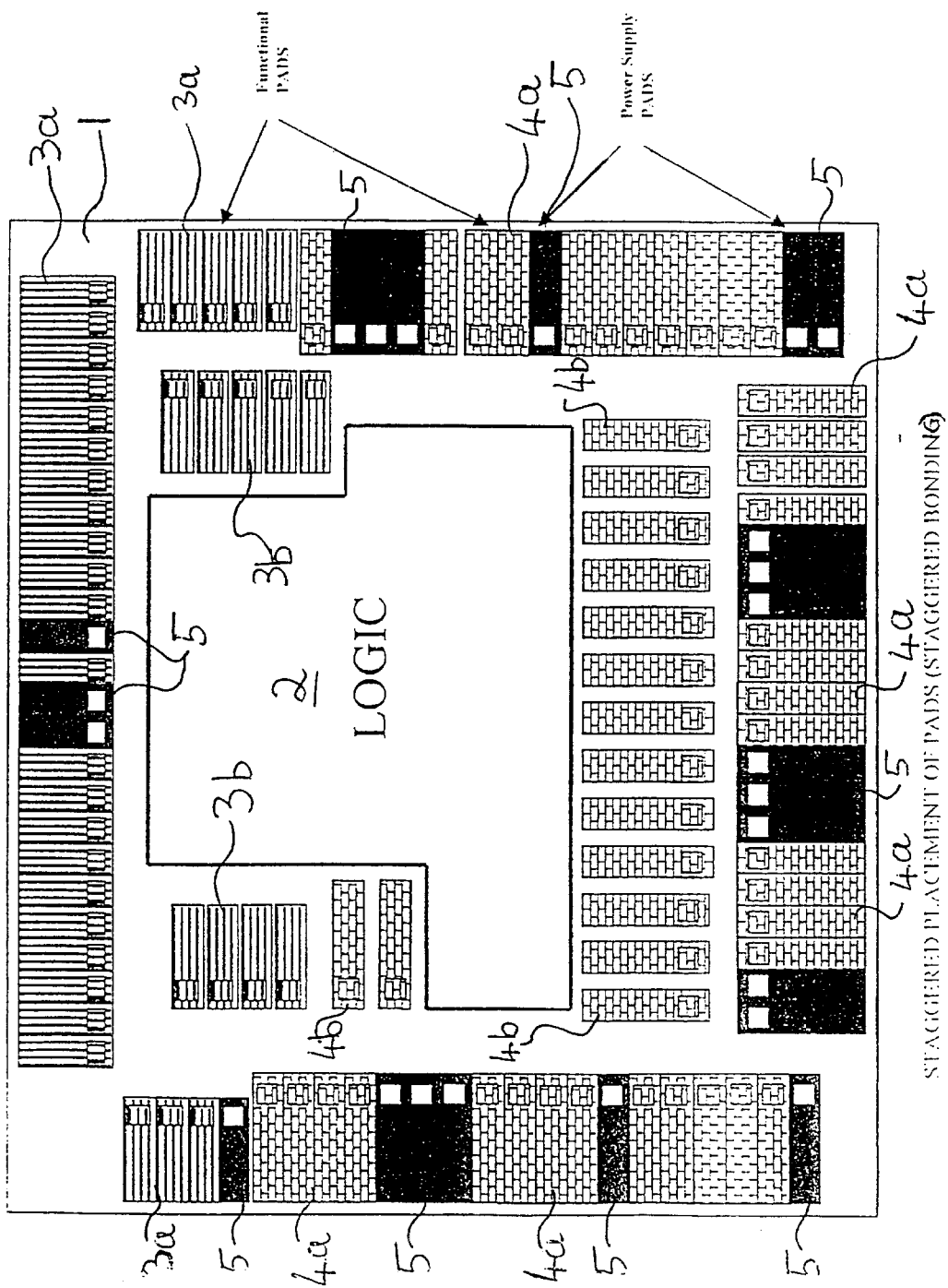
FIG. 1 is a plan view of a semiconductor chip in accordance with the invention.

FIG. 1 shows a silicon chip (or die) 1 which has on its surface a logic area 2 (which contains electronic functionality and systems), a number of functional bond pads 3, 4 and a number of power supply bond pads 5.

In conventional silicon chips, all the pads 3, 4, 5 are located adjacent the edges of the silicon chip to permit each of the bond pads 3, 4, 5 to be easily wire bonded to respective contact pins on a lead frame.

However, the inventors have realised that it is possible to reduce the size of the silicon chip 1 by providing pads 3b, 4b which are not adjacent to the edges of the silicon chip 1 and still permit wire bonding of the pads 3b, 4b to the respective contact pins on the lead frame during assembly. To facilitate this, as shown in FIG. 1, the bond pads 3b, 4b are offset from the bond pads 3a, 4a, 5 so that the bond pads 3b, 4b are generally not aligned with the bond pads 3a, 4a, 5. This permits the wire bonding from the bond pads 3b, 4b to extend between the wire bonding of adjacent bond pads 3a, 4a, 5.

Accordingly, the dimensions of the silicon chip 1 are minimised by providing bond pads 3b, 4b on surface areas of chip 1 within the core area (i.e. the area within the normal bond pad area) which are not occupied by the logic 2.

Figure 2:
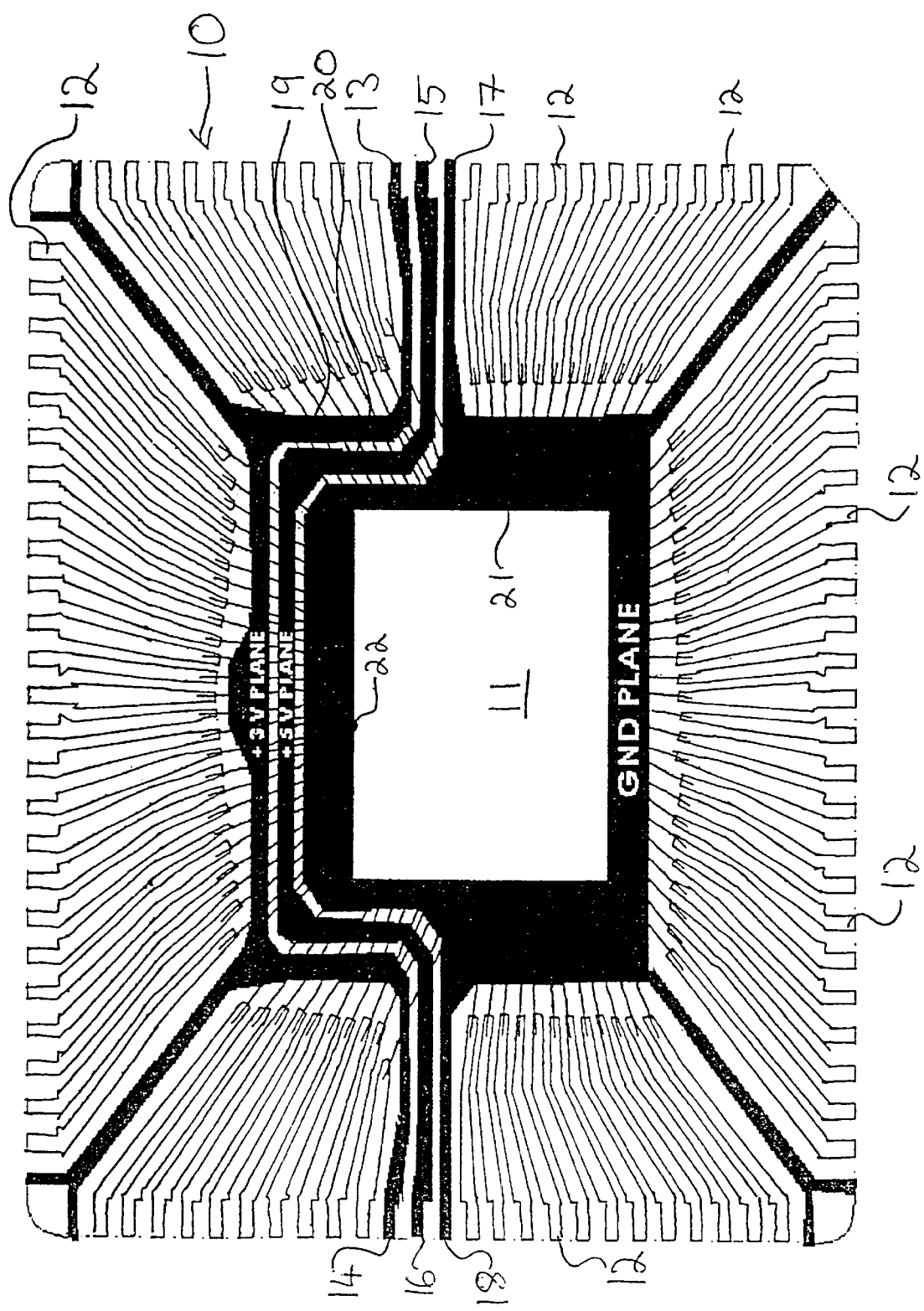
FIG. 2 is a plan view of a lead frame in accordance with the invention.

FIG. 2 shows a lead frame 10 which is adapted to have a chip 1 mounted on a die pad area 11. The lead frame 10 includes a number of functional contact pins 12, two +3 volt power supply contact pins 13, 14, two +5 volt power supply contact pins 15, 16 and two ground (or earth) contact pins 17, 18.

The ground contact pins 17, 18 are connected to a ground plane 21 on which the die pad area 11 is located to provide an electrical ground for the chip 1 when the chip 1 is attached to the die pad area 11. The +3 volt power supply contact pins 13, 14 are interconnected by a strip of metal material 19 which forms a +3 volt power supply plane. The +5 volt power supply contact pins 15, 16 are interconnected by a strip of metal material 20 which forms a +5 volt power supply plane. As shown in FIG. 2, the strip 20 is located between and spaced from the ground plane 21 and the strip 19. Similarly, the strip 19 is located between and spaced from the strip 20 and some of the contact pins 12. Therefore, the strips 19, 20 are electrically isolated from each other, the ground plane 21 and the pins 12.

As can be seen from FIG. 2, the strips 19, 20 extend along an edge 22 of the die pad area 11. Hence, when the chip 1 is attached to the die pad area 11, any of the power supply pads 5 adjacent to the edge 22 can easily be wire bonded to any point on the strips 19, 20. Hence, although the power supply pads 5 are not adjacent to the respective power supply pins 13, 14, 15, 16 they may be easily connected to the power supply pins 13, 14, 15, 16 by wire bonding the pads 5 to the respective strip 19, 20. This permits strategic placement of the power supply pads on the chip 1 to, for example, achieve good noise performance on the chip 1. In addition, it also permits strategic placement of multiple power supply pads without increasing the number of power supply pins 13, 14, 15, 16 which are required.

What is claimed is:

1. A lead frame comprising a die pad adapted to have a semiconductor chip mounted thereon and a number of contact pins adapted to be electrically coupled to bond pads on a semiconductor chip mounted on the die pad, in use, two of the contact pins being electrically coupled to each other by a contact strip which extends along at least a portion of an edge of the die pad, and the contact strip being located between the die pad and some of the other contact pins.

2. A lead frame according to claim 1, wherein two pairs of contact pins are each electrically coupled to each other, each pair being electrically coupled by a contact strip, such that the first contact strip is located between an edge of the die pad and the second contact strip is located between the first contact strip and some of the other contact pins.

3. A lead frame according to claim 1, wherein the contact strip extends along the full length of at least one edge of the die pad.

4. An electronic device comprising a lead frame according to claim 1, wherein the die pad has a semiconductor chip mounted thereon, and the bond pads are electrically coupled to the respective contact pins, the semiconductor chip comprising a semiconductor substrate having an electronic circuit thereon and a number of bond pads thereon, the bond pads being coupled to the electronic circuit and permitting power to be supplied to the electronic circuit and signals to be input to and output from the electronic circuit, the bond pads being arranged on the surface of the substrate such that at least some of the pads are separated from the edge of the substrate by other bond pads.

5. An electronic device according to claim 4, wherein the at least some pads are arranged such that they are offset from the immediately adjacent bond pads which are adjacent to the edge of the semiconductor substrate.

* * * * *